US006977861B1

(12) United States Patent
Matsui

(10) Patent No.: US 6,977,861 B1
(45) Date of Patent: Dec. 20, 2005

(54) NONVOLATILE SEMICONDUCTOR MEMORY DEVICE

(75) Inventor: Katsuaki Matsui, Kanagawa (JP)

(73) Assignee: Oki Electric Industry Co., Ltd., Minato-ku (JP)

( * ) Notice: Subject to any disclaimer, the term of this patent is extended or adjusted under 35 U.S.C. 154(b) by 0 days.

(21) Appl. No.: 10/911,515

(22) Filed: Aug. 5, 2004

(51) Int. Cl.[7] .................................................. G11C 8/00
(52) U.S. Cl. ............................. 365/230.06; 365/189.09
(58) Field of Search ....................... 365/230.06, 189.09; 327/333

(56) References Cited

U.S. PATENT DOCUMENTS 5,394,374 A * 2/1995 Ishimura et al. ....... 365/230.06
5,959,890 A * 9/1999 Yamamoto et al. .... 365/185.23
6,373,745 B2 * 4/2002 Saito et al. ................. 365/174

FOREIGN PATENT DOCUMENTS

JP 07-182860 7/1995
JP 07-192474 7/1995

* cited by examiner

*Primary Examiner*—Vu A. Le
(74) *Attorney, Agent, or Firm*—Nixon Peabody LLP; Donald R. Studebaker

(57) ABSTRACT

The present invention provides a nonvolatile semiconductor memory device capable of achieving the speeding-up of reading and a reduction in layout area. A control gate electrode of each of memory cell transistors employed in the nonvolatile semiconductor memory device according to the present invention is configured so as to be capable of assuming a first power supply potential (VCC) and a second power supply potential (VPP) higher than the first power supply potential upon its operation. A second NMOS transistor is provided between the gate of a first NMOS transistor that drives a control gate electrode (WL) to the first power supply potential (VCC) and a control signal (/ER) connected to the gate thereof. The source of the second NMOS transistor is inputted with the control signal (/ER) and the drain thereof is connected to the gate of the first NMOS transistor. A PMOS transistor is provided in parallel with the first NMOS transistor. A transfer gate comprising these NMOS and PMOS transistors drives the control gate electrode (WL).

2 Claims, 4 Drawing Sheets

NONVOLATILE SEMICONDUCTOR MEMORY DEVICE

BACKGROUND OF THE INVENTION

1. Field of the Invention

The present invention relates to a semiconductor nonvolatile memory, and particularly to a decode circuit suitable for an electrically data reprogrammable flash memory.

2. Description of the Related Art

An EEPROM has been known as an electrically erasable programmable semiconductor nonvolatile memory. A general EEPROM takes a stacked structure in which a memory cell transistor has a floating gate electrode and a control gate electrode. Upon data erasure, a boost or step-up level (VPP: about 12V) higher than a power supply level (VCC) used in a normal circuit is applied to a control gate electrode (WL) to pull or draw out electrical charges from a flowing gate electrode, thereby controlling the amount of the electrical charges in the floating gate electrode. That is, the amount of the electrical charges in the floating gate electrode is reduced to thereby bring the memory cell transistor into conduction when the power supply level (VCC) is applied to the corresponding control gate electrode (WL).

Upon reading, the control gate electrode (WL) is set to the power supply level (VCC) and a decision as to whether data is 1 or 0 is made according to conduction and non-conduction of the memory cell transistor. Thus, two cases arise in which the power supply level (VCC) is applied to the control gate electrode (WL) according to an operation mode and the step-up level (VPP) is applied thereto according to an operation mode.

FIG. 1 is a block diagram showing a control gate electrode type decode circuit (decode circuit) of a batch erasable programmable EEPROM (Flash EEPROM). FIGS. 2 through 5 are respectively configurational diagrams of respective circuits used in the decode circuit.

The decode circuit 1 comprises a predecode circuit 18 which inputs address signals A<1:0> and a control signal /CHIP brought to a ground level (VSS) at batch erasure, a redundant element 10 which holds and outputs a redundancy replacement flag (RDDEN) and redundant relief addresses (RA) set to a power supply level (VCC) where redundancy replacement is required, a redundancy determination circuit 12 which inputs the outputs (RA<1:0> and /RA<1:0>) of the redundant element and the outputs (XA<1:0> and /XA<1:0>) of the predecode circuit 18, a redundancy selector 14 which inputs the outputs (RXA<1:0>) of the redundancy determination circuit 12, the outputs (XA<1:0> and /XA<1:0>) of the predecode circuit 18 and the control signal /CHIP, a decoder array 16 which inputs the outputs (XEN and RXEN) of the redundancy selector 14, the outputs (XA<1:0> and /XA<1:0>) of the predecode circuit 18 and a control signal (ERASE), and a charge pump circuit 20 which supplies a boost or step-up level (VPP) to a boost or step-up power supply line (VEP) when the control signal ERASE is of the power supply level (VCC), and supplies the power supply level (VCC) to the step-up power supply line (VEP) when the control signal ERASE is of the ground level (VSS).

The decoder array 16 comprises a plurality of decoders (XDEC) 50 through 56 each of which inputs one of the outputs XA<0> and /XA<0> of the predecode circuit 18 and one of the outputs XA<1> and /XA<1> thereof, and the output XEN of the corresponding redundancy selector 14, a redundant decoder (RXDEC) 58 which inputs the output RXEN of the redundancy determination circuit 12, and a level shifter (LS1) which inputs the control signal (ERASE).

Each of the decoders (XDEC and RXDEC) comprises a logic gate (NA) which decodes each address, an inverter (INV) which inputs the output of the logic gate (NA), a transfer gate (CM00) of which the source is connected to the output of the inverter (INV) and the drain is connected to its corresponding control gate electrode (WL), a level shifter (LS0) which inputs the output of the logic gate (NA) and the output of the inverter (INV), and a transfer gate (CM01) of which the source is connected to the output of the level shifter (LS0) and the drain is connected to its corresponding control gate electrode (WL).

The transfer gate (CM00) comprises a PMOS transistor whose gate is configured as the output (ER) of the level shifter LS1, and an NMOS transistor whose gate is configured as the output (ER) of the level shifter LS1.

The transfer gate (CM01) comprises a PMOS transistor whose gate is configured as the output (ER) of the level shifter LS1, and an NMOS transistor whose gate is configured as the output (ER) of the level shifter LS1.

The operation of the conventional decode circuit 1 will be explained below with being divided into a read operation (a), an erase operation (b) and a batch erase operation (c).

(a) Read Operation

When data is read from the EEPROM (Flash EEPROM), a control signal /CHIP is set to a power supply level (VCC) and a control signal ERASE is held at a ground level (VSS). In this condition, address signals A<1:0> are inputted. Owing to the setting of the control signal /CHIP to the power supply level (VCC) at this time, a step-up power supply line (VEP) assumes the power supply level (VCC) and the control signal ERASE is set to the ground level (VSS). Thus, the output ER of the level shifter LS1 results in the ground level (VSS) and the output /ER thereof assumes the power supply level (VCC).

The outputs (RDDEN, RA<1:0> and /RA<1:0>) of the redundant element 10 respectively hold a predetermined logic level. That is, when no redundancy replacement is required, the RDDEN is held at the ground level (VSS), whereas when the redundancy replacement is required, the RDDEN holds the power supply level (VCC) and redundancy relief address data holds a potential corresponding to a control gate electrode WL<m> (where m=0, 1, 2 and 3) that needs replacement.

When address signals A<1:0> are inputted, the predecode circuit 18 converts the address signal A<n> (where n=0 and 1) into complementary address signals XA<n> (where n=0 and 1) and /XA<n> (where n=0 and 1) and outputs them.

If the value of the output RA<n> (where n=0 and 1) of the redundant element 10 is of the power supply level (VCC), then the redundancy determination circuit 12 outputs the address signal XA<n> (where n=0 and 1) to the corresponding redundant address RXA<n> (where n=0 and 1), whereas if the value of the output RA<n> (where n= 0 and 1) is of the ground level (VSS), then the redundancy determination circuit 12 outputs the address signal /XA<n> (where n=0 and 1) to the corresponding redundant address RXA<n> (where n=0 and 1).

That is, when the value of the output RXA<n> (where n=0 and 1) of the redundancy determination circuit 12 is of the power supply level (VCC), the value of the RA<n> (where n=0 and 1) assumes the power supply level (VCC) and the address signal XA<n> (where n=0 and 1) is brought to the power supply level (VCC). Alternatively, the value of the /RA<n> (where n=0 and 1) assumes the power supply level (VCC) and the address signal /XA<n> (where n=0 and 1) assumes the power supply level (VCC). Thus, the input address A<n> (where n=0 and 1) and the redundant relief address RA<n> (where n=0 and 1) are brought into coincidence.

When information (based on XA<1:0> and /XA<1:0> outputted from the predecoder 18 and RXA<1:0> outputted from the redundancy determination circuit 12) about the coincidence of the input addresses A<1:0> and the redundant relief addresses RA<1:0> is transmitted to the redundancy selector 14, the redundancy selector ANDs all the redundant addresses RXA<1:0> and the redundancy replacement flag RDDEN to thereby make a decision as to whether or not redundancy replacement is required. When the redundancy replacement is required, the redundancy selector outputs the power supply level (VCC) and the ground level (VSS) to the RXEN and XEN respectively. When no redundancy replacement is required, the redundancy selector outputs the ground level (VSS) and the power supply level (VCC) to the RXEN and XEN respectively.

Each of the decoders constituting the decoder arrays 50 through 58 ANDs one of the address signals (XA<0> and /XA<0>), one of the address signals XA<1> and /XA<1>, and the output XEN of the redundancy selector and thereby selects the corresponding control gate electrode WL<m> (where m=0, 1, 2 and 3). Further, the corresponding redundant control gate electrode RWL is selected according to the output RXEN of the redundancy selector.

When no redundancy replacement is required, for example, that is, the XEN is of the power supply level (VCC) and the RXEN is of the ground level (VSS), the input addresses A<1:0> are transmitted from the predecoder 18 to the decoders, and the result of a decision as to whether the redundancy replacement is required, is transmitted to each corresponding decoder via the predecoder circuit 18 and the redundancy determination circuit 12, whereby the control gate electrode WL<m> (where m=0, 1, 2 and 3) corresponding to the input addresses A<1:0> is selected.

When the redundancy replacement is required, that is, the XEN is of the ground level (VSS) and the RXEN is of the power supply level (VCC), the result of a decision as to whether the redundancy replacement is required, is transmitted to the corresponding decoder via the predecoder 18, redundancy determination circuit 12 and redundancy selector 14 so that the corresponding redundancy control gate electrode RWL is selected.

Since, at this time, the result of the decision as to whether the redundancy replacement is required, is transmitted to the corresponding decoder via the predecoder 18, redundancy determination circuit 12 and redundancy selector 14, the control gate electrodes WL<3:0> are brought to non-selection.

In the decoder which drives the selected control gate electrode, the output of a logic gate NA changes from the power supply level (VCC) to the ground level (VSS), and the output of an inverter INV changes from the ground level (VSS) to the power supply level (VCC). Since, at this time, a gate signal ER of a PMOS transistor constituting the transfer gate (CM00) and a gate signal /ER of an NMOS transistor constituting the transfer gate (CM00) are of the ground level (VSS) and the power supply level (VCC) respectively, the selected control gate electrode WL is driven to the power supply level (VCC) by the transistors constituting the transfer gate (CM00).

During the above operation, the control signal ERASE holds the ground level (VSS), and the charge pump circuit 20 inputted with the control signal ERASE supplies the power supply level (VCC) to the step-up power supply line (VEP).

(b) Erase Operation

When the data stored in the EEPROM (Flash EEPROM) is erased, a control signal /CHIP is set to a power supply level (VCC) and a control signal ERASE is held at a ground level (VSS). In this condition, address signals A<1:0> are inputted. Owing to the setting of the control signal /CHIP to the power supply level (VCC) at this time, a step-up power supply line (VEP) assumes the power supply level (VCC) and the control signal ERASE is set to the ground level (VSS). Thus, the output ER of the level shifter LS1 takes the ground level (VSS) and the output /ER thereof assumes the power supply level (VCC). The outputs (RDDEN, RA<1:0> and /RA<1:0>) of the redundant element 10 respectively hold a predetermined logic level.

When no redundancy replacement is required, the RDDEN holds the ground level (VSS)). When the redundancy replacement is required, the RDDEN holds the power supply level (VCC)), redundancy relief address data holds a potential corresponding to a control gate electrode WL<m> (where m=0, 1, 2 and 3) that needs replacement.

When the address signals A<1:0> are inputted, the predecode circuit 18 converts the address signal A<n> (where n=0 and 1) into complementary address signals XA<n> (where n=0 and 1) and /XA<n> (where n=0 and 1) and outputs them.

If the value of the output RA<n> (where n=0 and 1) of the redundant element 10 is of the power supply level (VCC), then the redundancy determination circuit 12 outputs the address signal XA<n> (where n=0 and 1) to the corresponding redundant address RXA<n> (where n=0 and 1), whereas if the value of the output RA<n> (where n= 0 and 1) is of the ground level (VSS), then the redundancy determination circuit 12 outputs the address signal /XA<n> (where n=0 and 1) to the corresponding redundant address RXA<n> (where n=0 and 1).

When the value of the output RXA<n> (where n=0 and 1) of the redundancy determination circuit 12 is of the power supply level (VCC), the value of the RA<n> (where n= 0 and 1) assumes the power supply level (VCC) and the address signal XA<n> (where n=0 and 1) is brought to the power supply level (VCC). Alternatively, the value of the /RA<n> (where n=0 and 1) assumes the power supply level (VCC) and the address signal /XA<n> (where n=0 and 1) assumes the power supply level (VCC). Thus, the input address A<n> (where n=0 and 1) and the redundant relief address RA<n> (where n=0 and 1) are brought into coincidence.

When information about the coincidence of the input addresses A<1:0> and the redundant relief addresses RA<1:0> is transmitted to the redundancy selector 14 via the predecoder 18 and the redundancy determination circuit 12, the redundancy selector 14 ANDs all the redundant addresses RXA<1:0> and the redundancy replacement flag RDDEN to thereby make a decision as to whether or not redundancy replacement is required. When the redundancy replacement is required, the redundancy selector outputs the power supply level (VCC) and the ground level (VSS) to the RXEN and XEN respectively. When no redundancy replacement is required, the redundancy selector outputs the ground level (VSS) and the power supply level (VCC) to the RXEN and XEN respectively.

Each of the decoders constituting the decoder array 16 ANDs one of the address signals XA<0> and /XA<0>, one of the address signals XA<1> and /XA<1>, and the output XEN of the redundancy selector 14 and thereby selects the corresponding control gate electrode WL<m> (where m=0, 1, 2 and 3). Further, the corresponding redundant control gate electrode RWL is selected according to the output RXEN of the redundancy selector 14.

When no redundancy replacement is required, for example, that is, the XEN is of the power supply level (VCC) and the RXEN is of the ground level (VSS), the input addresses A<1:0> are transmitted from the predecoder 18 to the decoders, and the result of a decision as to whether the redundancy replacement is required, is transmitted to the corresponding decoder via the predecoder 18, the redundancy determination circuit 12 and the redundancy selector 14, whereby the control gate electrode WL<m> (where m=0, 1, 2 and 3) corresponding to the input addresses A<1:0> is selected.

When the redundancy replacement is required, that is, the XEN is of the ground level (VSS) and the RXEN is of the power supply level (VCC), the result of a decision as to whether the redundancy replacement is required, is transmitted to the corresponding decoder via the predecoder 18, the redundancy determination circuit 12 and the redundancy selector 14 so that the corresponding redundancy control gate electrode RWL is selected.

Since, at this time, the result of the decision as to whether the redundancy replacement is required, is transmitted to the corresponding decoder via the predecoder 18, redundancy determination circuit 12 and redundancy selector 14, the control gate electrodes WL<3:0> are brought to non-selection.

When the control signal ERASE is next raised from the ground level (VSS) to the power supply level (VCC), the charge pump circuit 20 inputted with the control signal ERASE supplies a step-up level (VPP) to its corresponding step-up power supply line (VEP), and the output /ER of the level shifter (LS1) is changed to the ground level (VSS) and the output ER thereof is transitioned to the step-up level (VPP).

Owing to the supply of the step-up level (VPP) to the step-up power supply line (VEP), the output of the level shifter (LS0) in the decoder which drives the selected control gate electrode, is changed to the step-up level (VPP) and the output /ER thereof is brought to the ground level (VSS), whereby the selected control gate electrode is driven to the step-up level (VPP) through the corresponding level shifter (LS0) and transfer gate (CM01).

(c) Batch Erase Operation

When the data of the EEPROM (Flash EEPROM) is collectively erased, a control signal /CHIP is first set to a power supply level (VCC) and a control signal ERASE is held at a ground level (VSS). Owing to the setting of the control signal /CHIP to the power supply level (VCC) at this time, a step-up power supply line (VEP) assumes the power supply level (VCC) and the control signal ERASE is set to the ground level (VSS). Thus, the output ER of the level shifter LS1 takes the ground level (VSS) and the output /ER thereof assumes the power supply level (VCC). The outputs (RDDEN, RA<1:0> and /RA<1:0>) of the redundant element respectively hold a predetermined logic level.

When no redundancy replacement is required, the RDDEN holds the ground level (VSS). When the redundancy replacement is required, the RDDEN holds the power supply level (VCC), redundancy relief address data holds a potential corresponding to a control gate electrode WL<m> (where m=0, 1, 2 and 3) that needs replacement.

When the control signal /CHIP is transitioned to the ground level (VSS) in this condition, the predecode circuit 18 outputs the power supply level (VCC) to both of complementary address signals XA<n> (where n=0 and 1) and /XA<n> (where n=0 and 1).

Since both of the complementary address signals XA<n> (where n=0 and 1) and /XA<n> (where n=0 and 1) are of the power supply level (VCC), the redundancy determination circuit 12 outputs the power supply level (VCC) to the redundant addresses RXA<1:0> without depending on the output RA<n> (where n=0 and 1) of the redundant element 10. Since the control signal /CHIP is of the ground level (VSS), the redundancy selector 14 outputs the power supply level (VCC) to both of the XEN and RXEN.

On the other hand, each of the decoders constituting the decoder array 16 ANDs one of the address signals XA<0> and /XA<0>, one of the address signals XA<1> and /XA<1>, and the output XEN of the redundancy selector 14 and thereby selects the corresponding control gate electrode WL<m> (where m=0, 1, 2 and 3). Further, the corresponding redundant control gate electrode RWL is selected according to the output RXEN of the redundancy selector 14. However, all the control gate electrodes WL<3:0> and the redundant control gate electrode RWL are selected to bring all of the inputs of the decoders and redundant decoder to the power supply level (VCC).

In the decoder which drives the selected control gate electrode, the output of a logic gate NA changes from the power supply level (VCC) to the ground level (VSS), the output of an inverter INV changes from the ground level (VSS) to the power supply level (VCC), and the output of a level shifter (LS0) is transitioned to the power supply level (VCC).

When the control signal ERASE is next raised from the ground level (VSS) to the power supply level (VCC), the charge pump circuit 20 supplies a step-up level (VPP) to its corresponding step-up power supply line (VEP), and the output /ER of a level shifter (LS1) is changed to the ground level (VSS) and the output ER thereof is transitioned to the step-up level (VPP).

Owing to the supply of the step-up level (VPP) to the step-up power supply line (VEP), the output of the level shifter (LS0) in the decoder which drives the selected control gate electrode, is changed to the step-up level (VPP) and the output /ER thereof is brought to the ground level (VSS), whereby the selected control gate electrode is driven to the step-up level (VPP) through the corresponding level shifter (LS0) and transfer gate (CM01).

Since the control gate electrode is driven to a step-up level (VPP: about 12V) higher than a power supply level (VCC) used in a normal circuit upon data erasure in the EEPROM (Flash EEPROM), all the MOS transistors connected to the control gate electrodes and the boost or step-up power supply line (VEP) need a withstand voltage greater than the step-up level (VPP: about 12V).

In general, high withstanding of each MOS transistor is realized by thickening a gate oxide film and lengthening a gate length to thereby relax an electric field between respective terminals of the MOS transistors. However, a problem arises in that the MOS transistors are reduced in drive capacity.

In the conventional decode circuit, the level shifters (LS0 and LS1) and the transfer gates (CM00 and CM01) are respectively made up of high-withstand MOS transistors. However, the control gate electrode at reading is driven through the transfer gate (CM00). Thus, the reduction in the drive capacity of each of the MOS transistors constituting the transfer gate (CM00) incurs a delay in the operation of the control gate electrode. This delay is noticeable in particular upon the rise of a control gate electrode (WL) by a P type MOS transistor lower in channel mobility.

As a method of suppressing the delay in the rise of the control gate electrode, there has been known a method of expanding a gate width of each of P type MOS transistors constituting a transfer gate (CM00) to thereby ensure drive capacity of the transfer gate (CM00). Since, however, the transfer gate (CM00) needs a long gate width for the purpose of its high withstanding and is required for each control gate electrode, an increase in layout area cannot be avoided.

Even in the case of either a case in which the control gate electrode WL<m> (where m=0, 1, 2 and 3) is selected or a case in which the control gate electrode WL<m> (where m=0, 1, 2 and 3) is not selected, the conventional decode circuit needs the transfer of the result of a decision as to whether redundancy replacement is required, to the corresponding decoder via a predecoder, a redundancy determination circuit and a redundancy selector in addition to a path through which the input address A<n> is transmitted. Therefore, a delay in reading occurs in the path.

In the conventional decode circuit, all the control gate electrodes (WL<3:0> and RWL) are driven to the step-up level (VPP) upon batch erasure regardless of whether the redundant relief is required. There is, however, a possibility that when a defect with a leak has occurred in the control gate electrode WL<m> (where m=0, 1, 2 and 3), for example, the control gate electrode WL<m> (where m= 0, 1, 2 and 3) having such a leak will be driven to a step-up level (VPP), thus causing a reduction in the step-up level (VPP) due to the leak from the control gate electrode WL<m> (where m=0, 1, 2 and 3).

On the other hand, since a control gate electrode WL<i> (where i≠m) having no defect is also driven to the step-up level (VPP), there is a possibility that a failure will occur even in the control gate electrode WL<i> (where i≠m) having no defect where the step-up level (VPP) is reduced.

SUMMARY OF THE INVENTION

The present invention has been made in view of the foregoing problems. It is an object of the present invention to provide a nonvolatile semiconductor memory device capable of making a reading speed faster and reducing a layout area.

According to one aspect of the present invention, for achieving the above object, there is provided a nonvolatile semiconductor memory device comprising memory cell transistors. A control gate electrode of each memory cell transistor is configured so as to be able to assume a first power supply potential (VCC) and a second power supply potential (VPP) higher than the first power supply potential upon its operation. A second NMOS transistor is provided between the gate of a first NMOS transistor which drives the control gate electrode (WL) to the first power supply potential (VCC) and a control signal (/ER) connected to the gate thereof. The source of the second NMOS transistor is inputted with the control signal (/ER), and the drain thereof is connected to the gate of the first NMOS transistor. A PMOS transistor is disposed in parallel with the first NMOS transistor. A transfer gate comprising these NMOS and PMOS transistors drives the control gate electrode (WL).

The above and further objects and novel features of the invention will more fully appear from the following detailed description appended claims and the accompanying drawings.

DETAILED DESCRIPTION OF THE PREFERRED EMBODIMENTS

Preferred embodiments of the present invention will be explained hereinafter in detail with reference to the accompanying drawings.

Figure 1:
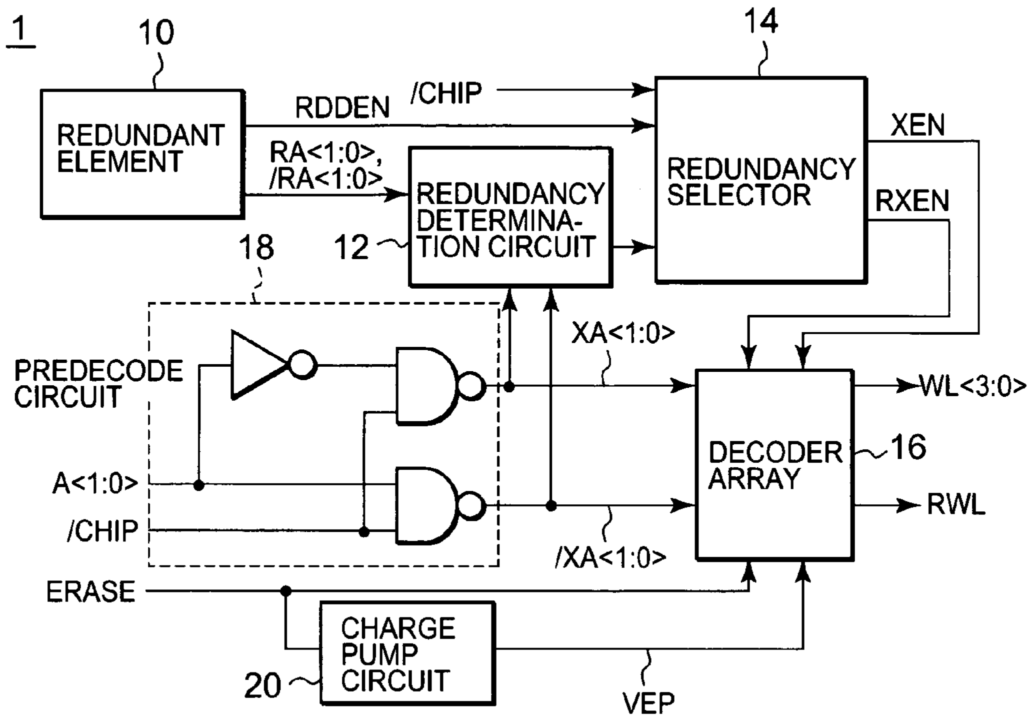
FIG. 1 is a block diagram showing a configuration of a conventional decode circuit.
Figure 2:
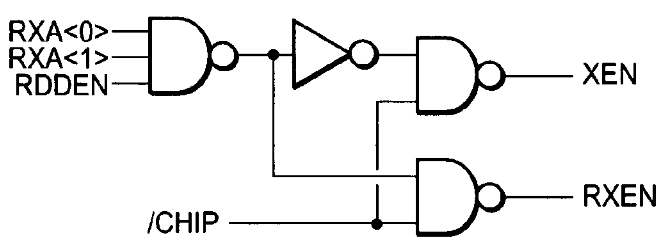
FIG. 2 is a circuit diagram illustrating an internal configuration of a conventional redundancy selector.
Figure 3:
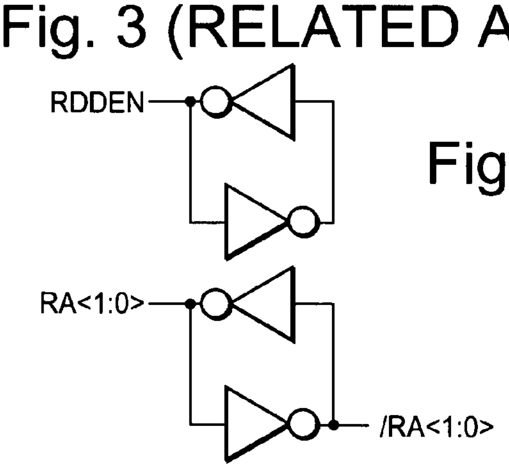
FIG. 3 is a diagram depicting a redundant element.
Figure 4:
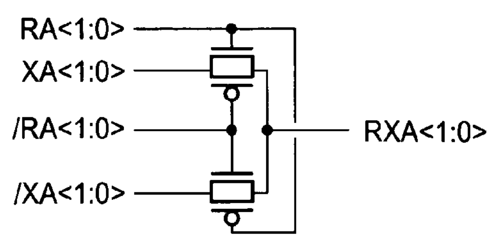
FIG. 4 is a circuit diagram showing an internal configuration of a redundancy determination circuit.
Figure 5:
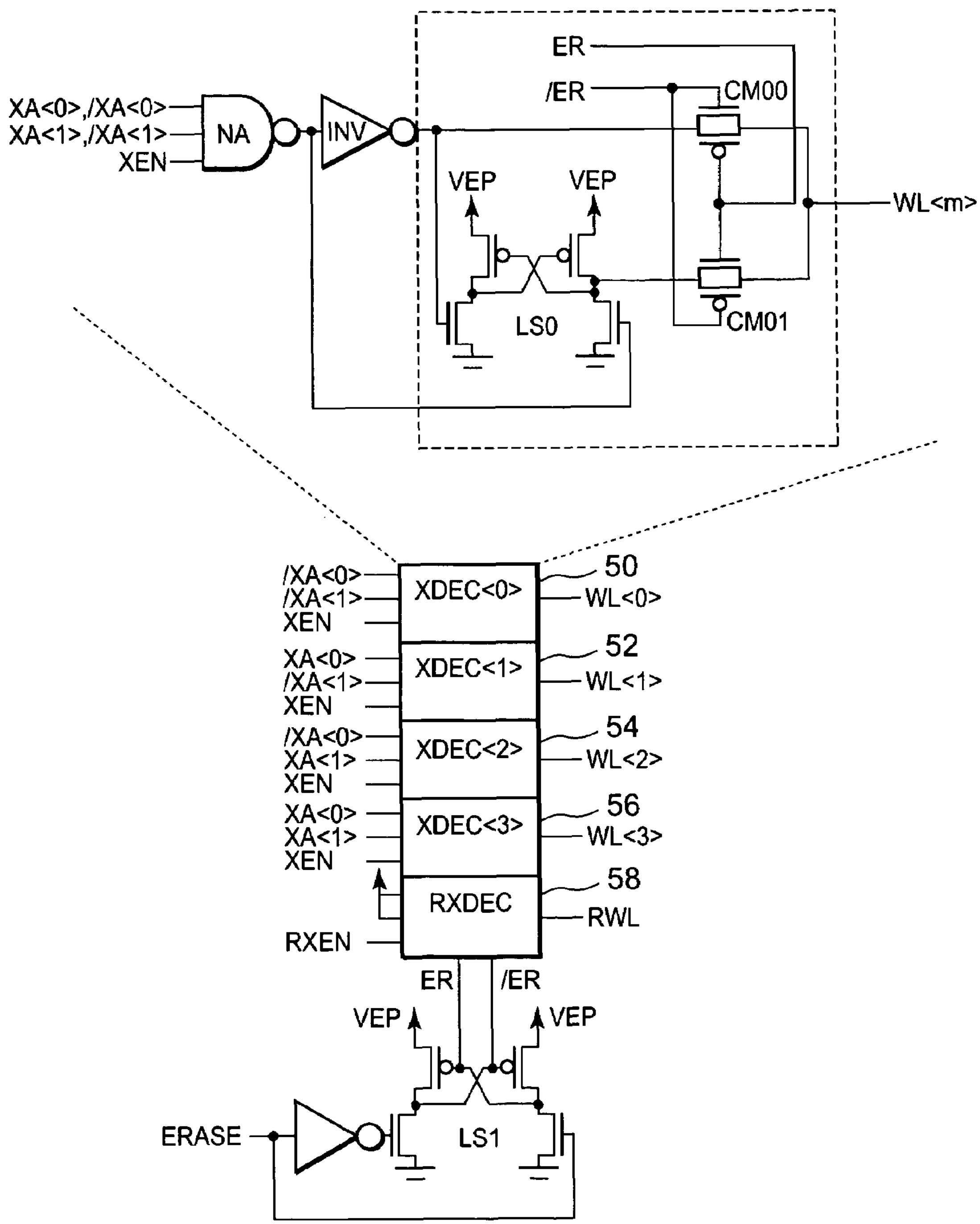
FIG. 5 is a block diagram illustrating a configuration of a conventional decoder array.
Figure 6:
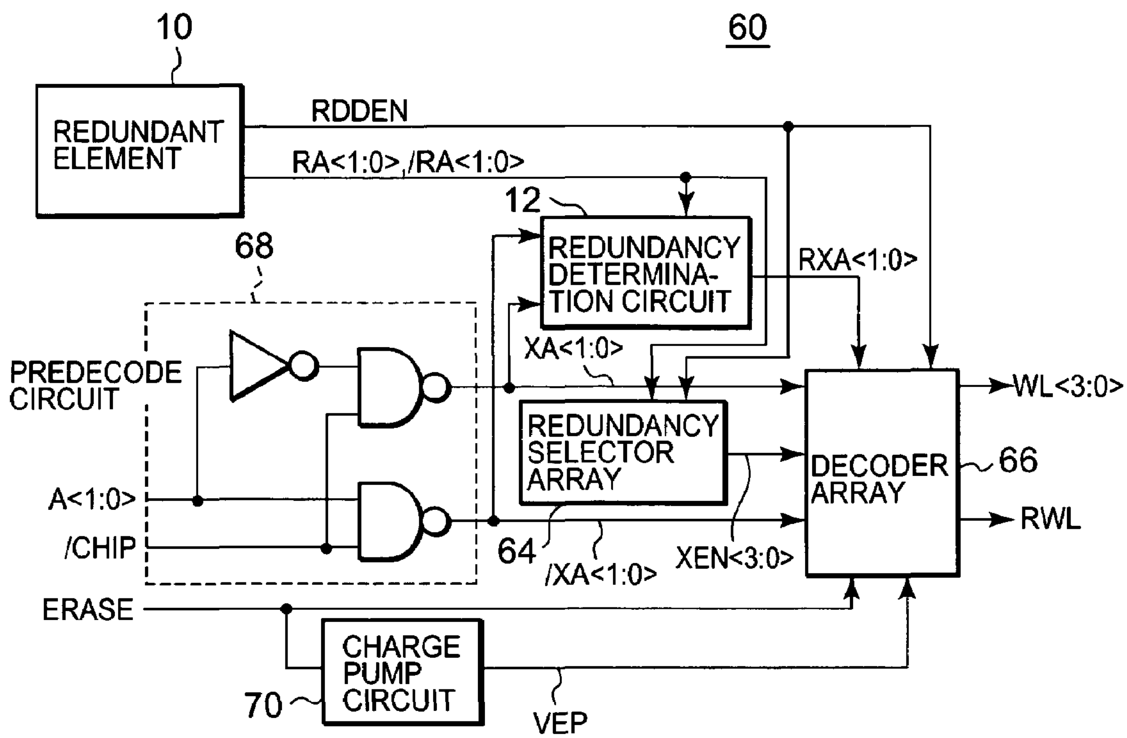
FIG. 6 is a block diagram depicting a specific example of a decode circuit of the present invention.
Figure 7:
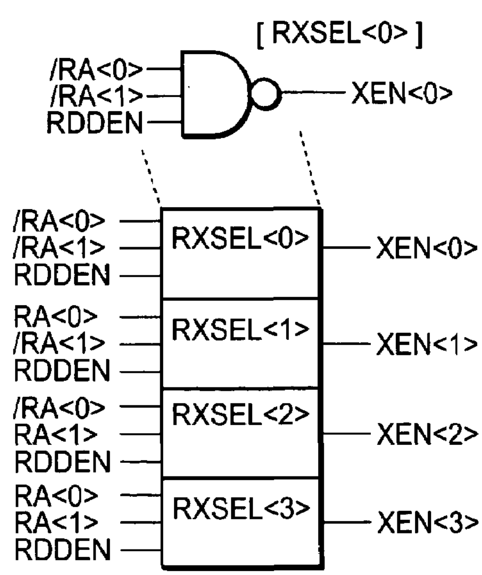
FIG. 7 is a block diagram showing a configuration of a redundancy selector array of the present invention.
Figure 8:
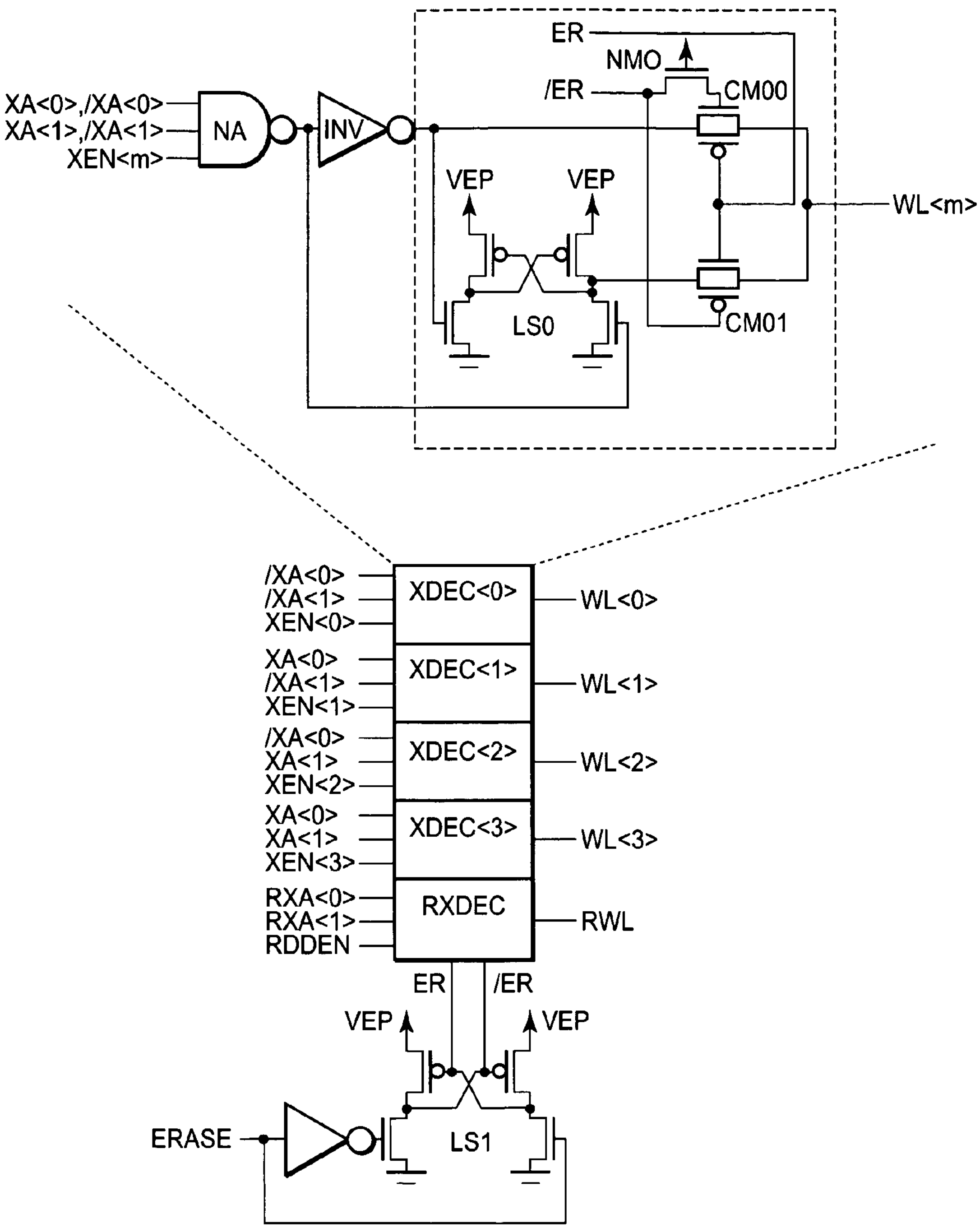
FIG. 8 is a block diagram illustrating a configuration of a decoder array of the present invention.

FIG. 6 is a block diagram showing a configuration of a control gate electrode (WL) type decode circuit of the present invention. FIGS. 7 and 8 are respectively configurational diagrams of respective circuits employed in the present decode circuit. A redundant element and a redundancy determination circuit are similar to the conventional circuits.

The present decode circuit 60 comprises a predecode circuit 68 which inputs address signals A<1:0> and a control signal /CHIP, a redundant element 10 which holds and outputs a redundancy replacement flag (RDDEN) and a redundant relief address (RA) set to a power supply level (VCC) where redundancy replacement is required, a redundancy determination circuit 12 which inputs the outputs (RA<1:0>, /RA<1:0>) of the redundant element and the outputs (XA<1:0>, /XA<1:0>) of the predecode circuit 68, a redundancy selector array 64 which inputs the outputs (RDDEN, RA<1:0>, /RA<1:0>) of the redundant element, a decoder array 66 which inputs the output (RDDEN) of the redundant element 10, the outputs (XEN<3:0>) of the redundancy selector array 64, the outputs (RXA<1:0>) of the redundancy determination circuit 12, the outputs (XA<1:0>, /XA<1:0>) of the predecode circuit 68, and a control signal ERASE, and a charge pump circuit 70 which supplies a boost or step-up level (VPP) to a step-up power supply line (VEP) in response to a power supply level (VCC) of the control signal ERASE and supplies a power supply level (VCC) to its corresponding step-up power supply line (VEP) in response to a ground level (VSS) of the ERASE.

The redundancy selector array 64 comprises a plurality of redundancy selectors each of which inputs one of the outputs RA<0> and RA/<0> and one of the outputs RA<1> and /RA<1>, and RDDEN.

The decoder array 66 comprises a plurality of decoders (XDEC) each of which inputs one of the outputs XA<0> and /XA<0> of the predecode circuit 68 and one of the outputs XA<1> and /XA<1> thereof, and the output XEN<m> (where m= 0, 1, 2 and 3) of the corresponding redundancy selector, a redundant decoder (RXDEC) which inputs the outputs RXA<1:0> of the redundancy determination circuit 12 and the output RDDEN of the redundant element 10, and a level shifter (LS1) which inputs the control signal (ERASE).

Each of the decoders (XDEC and RXDEC) comprises a logic gate (NA) which decodes each address, an inverter (INV) which inputs the output of the logic gate (NA), a transfer gate (CM00) of which the source is connected to the output of the inverter (INV) and the drain is connected to the control gate electrode (WL), a level shifter (LS0) which inputs the output of the logic gate (NA) and the output of the inverter (INV), a transfer gate (CM01) of which the source is configured as the output of the level shifter (LS0) and the drain is configured as a control gate electrode (WL), and an NMOS transistor (NM0) of which the source is configured as the output (/ER) of the level shifter LS1 and the gate is biased to a power supply level (VCC).

The transfer gate (CM00) comprises a PMOS transistor whose gate is connected to the output (ER) of the level shifter LS1, and an NMOS transistor whose gate is connected to the drain of the NMOS transistor (NM0).

The transfer gate (CM01) comprises a PMOS transistor whose gate is connected to the output (/ER) of the level shifter LS1, and an NMOS transistor whose gate is connected to the output (ER) of the level shifter LS1.

The operation of the decode circuit according to the specific example will be explained below with being divided into a read operation (a), an erase operation (b) and a batch erase operation (c).

(a) Read Operation

When data is read from an EEPROM (Flash EEPROM), a control signal /CHIP is set to a power supply level (VCC) and a control signal ERASE is held at a ground level (VSS). In this condition, address signals A<1:0> are inputted. Owing to the setting of the control signal /CHIP to the power supply level (VCC) at this time, the potential of the step-up power supply line (VEP) assumes the power supply level (VCC) and the control signal ERASE is set to the ground level (VSS). Thus, the output ER of the level shifter LS1 takes the ground level (VSS) and the output /ER thereof assumes the power supply level (VCC), and the gate of the NMOS transistor constituting the transfer gate (CM00) is brought to a potential (VCC−Vt) lower than the power supply level (VCC) by a threshold voltage.

The outputs (RDDEN, RA<1:0> and /RA<1:0>) of the redundant element 10 and the XEN<3:0> which determine logic, based on the outputs of the redundant element, respectively hold a predetermined logic level.

When no redundancy replacement is required (RDDEN is of the ground level (VSS)), all the outputs XEN<3:0> are maintained at the power supply level (VCC) respectively. When the redundancy replacement is required (RDDEN is of the power supply level (VCC)), an output XEN<m> (where m= 0, 1, 2 and 3) corresponding to a control gate electrode WL<m> (where m=0, 1, 2 and 3) of a cell that needs replacement, holds the ground level (VSS), and the output other than it, i.e., XEN<i> (where i≠m) holds the power supply level (VCC).

When address signals A<1:0> are inputted in this condition, the predecode circuit 68 converts the address signal A<n> (where n=0 and 1) into complementary address signals XA<n> (where n=0 and 1) and /XA<n> (where n=0 and 1) and outputs them. If the value of the output RA<n> (where n=0 and 1) of the redundant element 10 is of the power supply level (VCC), then the redundancy determination circuit 12 outputs the address signal XA<n> (where n=0 and 1), whereas if the value of the output RA<n> (where n=0 and 1) is of the ground level (VSS), then the redundancy determination circuit 12 outputs the address signal /XA<n> (where n=0 and 1) to the corresponding redundant address RXA<n> (where n=0 and 1).

When the value of the redundant address RXA<n> (where n=0 and 1) is of the power supply level (VCC), the value of the RA<n> (where n=0 and 1) assumes the power supply level (VCC) and the address signal XA<n>(where n=0 and 1) is brought to the power supply level (VCC). Alternatively, the value of the /RA<n> (where n=0 and 1) assumes the power supply level (VCC) and the address signal /XA<n> (where n=0 and 1) assumes the power supply level (VCC). Thus, the input address A<n> (where n=0 and 1) and the redundant relief address RA<n> (where n=0 and 1) are brought into coincidence.

On the other hand, each of the decoders (XDEC<0:3>) constituting the decoder array 66 ANDs one of the address signals XA<0> and /XA<0>, one of the address signals XA<1> and /XA<1>, and the output XEN<m> (where m=0, 1, 2 and 3) of the redundancy selector array and thereby selects the corresponding control gate electrode WL<m> (where m=0, 1, 2 and 3). The decoder RXDEC ANDs the outputs RXA<1:0> of the redundancy determination circuit 12 and the output RDDEN of the redundant element 10 and thereby selects the corresponding redundant control gate electrode RWL.

When the redundancy replacement is not required, that is, the RDDEN is of the ground level (VSS) or the input addresses A<1:0> are different from the redundant relief addresses RA<1:0> held in the redundant element, the input addresses A<1:0> are transferred from the predecode circuit 68 to the decoder so that a control gate electrodes WL<m> (where m=0, 1, 2 and 3) corresponding to the input addresses A<1:0> is selected.

When the redundancy replacement is required, that is, the RDDEN is of the power supply level (VCC) and the input addresses A<1:0> coincide with the redundant relief addresses RA<1:0> retained in the redundant element 10, information about the coincidence of the input addresses A<1:0> and the redundant relief addresses RA<1:0> is transmitted to the corresponding redundant decoder so that the corresponding redundant control gate electrode RWL is selected. Since, at this time, the redundant relief addresses RA<1:0> held in the redundant element 10 are already transmitted to the decoder XDEC<m> (where m=0, 1, 2 and 3) through the redundancy selector RXSEL<m> (where m=0, 1, 2 and 3), the control gate electrode WL<m> (where m=0, 1, 2 and 3) corresponding to the input addresses A<1:0> is not selected.

In the decoder which drives the selected control gate electrode, the output of a logic gate NA changes from the power supply level (VCC) to the ground level (VSS). Thus, the output of an inverter INV is transitioned from the ground level (VSS) to the power supply level (VCC). Since, at this time, the gate of an NMOS transistor constituting a transfer gate (CM00) is separated from /ER by an NMOS transistor NM0, the gate thereof is self-boosted to rise to a potential of about 2*VCC−Vt.

The control gate electrode of the selected cell is driven to the power supply level (VCC) by both the NMOS transistor and PMOS transistor constituting the transfer gate (CM00).

The PMOS transistor constituting the transfer gate (CM00) can also be deleted. Since, however, the gate potential of the NMOS transistor, which has been boosted by self boost, is considered to drop along the passage of time, this may preferably be utilized in combination to hold the control gate electrode at the power supply level (VCC).

During the above operation, the control signal ERASE holds the ground level (VSS), and the charge pump circuit inputted with the control signal ERASE supplies the power supply level (VCC) to the step-up power supply line (VEP).

(b) Erase Operation

When the data stored in the EEPROM (Flash EEPROM) is erased, a control signal /CHIP is set to a power supply level (VCC) and a control signal ERASE is held at a ground level (VSS). In this condition, address signals A<1:0> are inputted. Owing to the setting of the control signal /CHIP to the power supply level (VCC) at this time, a step-up power supply line (VEP) assumes the power supply level (VCC) and the control signal ERASE is set to the ground level (VSS). Thus, the output ER of the level shifter LS1 takes the ground level (VSS) and the output /ER thereof assumes the power supply level (VCC), and the gate of a NMOS transistor constituting a transfer gate (CM00) is brought to a potential (VCC−Vt) lower than the power supply level (VCC) by a threshold voltage.

The outputs (RDDEN, RA<1:0> and /RA<1:0>) of the redundant element and XEN<3:0> which determine logic, based on the outputs of the redundant element, respectively hold a predetermined logic level.

When no redundancy replacement is required (RDDEN is of the ground level (VSS)), all the outputs XEN<3:0> are maintained at the power supply level (VCC) respectively. When the redundancy replacement is required (RDDEN is of the power supply level (VCC)), an output XEN<m> (where m=0, 1, 2 and 3) corresponding to a control gate electrode WL<m> (where m=0, 1, 2 and 3) that needs replacement, holds the ground level (VSS), and the output other than it, i.e., XEN<i> (where i≠m) holds the power supply level (VCC).

When the address signals A<1:0> are inputted in this condition, the predecode circuit 68 converts the address signal A<n> (where n=0 and 1) into complementary address signals XA<n> (where n=0 and 1) and /XA<n> (where n=0 and 1) and outputs them therefrom.

If the value of the output RA<n> (where n=0 and 1) of the redundant element 10 is of the power supply level (VCC), then the redundancy determination circuit 12 outputs the address signal XA<n> (where n=0 and 1) to the corresponding redundant address RXA<n> (where n=0 and 1), whereas if the value of the output RA<n> (where n= 0 and 1) is of the ground level (VSS), then the redundancy determination circuit 12 outputs the address signal /XA<n> (where n=0 and 1) to the corresponding redundant address RXA<n> (where n=0 and 1).

That is, when the value of the redundant address RXA<n> (where n=0 and 1) is of the power supply level (VCC), the value of the RA<n> (where n=0 and 1) assumes the power supply level (VCC) and the address signal XA<n> (where n=0 and 1) is brought to the power supply level (VCC). Alternatively, the value of the /RA<n> (where n=0 and 1) assumes the power supply level (VCC) and the address signal /XA<n> (where n=0 and 1) assumes the power supply level (VCC). Thus, the input address A<n> (where n=0 and 1) and the redundant relief address RA<n> (where n=0 and 1) are brought into coincidence.

On the other hand, each of decoders (XDEC<0:3>) constituting the decoder array 66 ANDs one of the address signals XA<0> and /XA<0>, one of the address signals XA<1> and /XA<1>, and the output XEN<m> (where m=0, 1, 2 and 3) of the redundancy selector array 64 and thereby selects the corresponding control gate electrode WL<m> (where m=0, 1, 2 and 3). The redundant decoder RXDEC ANDs the outputs RXA<1:0> of the redundancy determination circuit 12 and the output RDDEN of the redundant element 10 and thereby selects the corresponding redundant control gate electrode RWL.

When the redundancy replacement is not required, that is, the RDDEN is of the ground level (VSS) or the input addresses A<1:0> are different from the redundant relief addresses RA<1:0> held in the redundant element, the input addresses A<1:0> are transferred to the corresponding decoder so that a control gate electrode WL<m> (where m=0, 1, 2 and 3) corresponding to the input addresses A<1:0> is selected. When the redundancy replacement is required, that is, the RDDEN is of the power supply level (VCC) and the input addresses A<1:0> coincide with the redundant relief addresses RA<1:0> retained in the redundant element, information about the coincidence of the input addresses A<1:0> and the redundant relief addresses RA<1:0> is transmitted to the corresponding redundant decoder via the predecoder 68 and the redundancy determination circuit 12 so that the corresponding redundant control gate electrode RWL is selected.

Since, at this time, the redundant relief addresses RA<1:0> held in the redundant element 10 are already transmitted to the decoder XDEC<m> (where m=0, 1, 2 and 3), the control gate electrode WL<m> (where m=0, 1, 2 and 3) corresponding to the input addresses A<1:0> is not selected.

In the decoder which drives the selected control gate electrode, the output of a logic gate NA changes from the power supply level (VCC) to the ground level (VSS), the output of an inverter INV is transitioned from the ground level (VSS) to the power supply level (VCC), and the output of a level shifter (LS0) changes to the power supply level (VCC).

When the control signal ERASE is raised from the ground level (VSS) to the power supply level (VCC), the charge pump circuit inputted with the control signal ERASE supplies a step-up level (VPP) to its corresponding step-up power supply line (VEP), and the output /ER of the level shifter (LS1) is changed to the ground level (VSS) and the output ER thereof is transitioned to the step-up level (VPP).

Owing to the supply of the step-up level (VPP) to the step-up power supply line (VEP), the output of the level shifter (LS0) of the decoder which drives the selected control gate electrode, is changed to the step-up level (VPP) and the output /ER thereof is brought to the ground level (VSS), whereby the selected control gate electrode is driven to the step-up level (VPP) through the corresponding level shifter (LS0) and transfer gate (CM01).

(c) Batch Erase Operation

When the data of the EEPROM (Flash EEPROM) is collectively erased, a control signal /CHIP is first set to a power supply level (VCC) and a control signal ERASE is held at a ground level (VSS). Owing to the setting of the control signal /CHIP to the power supply level (VCC) at this time, a step-up power supply line (VEP) assumes the power supply level (VCC) and the control signal ERASE is set to the ground level (VSS). Thus, the output ER of the level shifter LS1 takes the ground level (VSS) and the output /ER thereof assumes the power supply level (VCC).

The outputs (RDDEN, RA<1:0> and /RA<1:0>) of the redundant element 10 and outputs XEN<3:0> which determine logic, based on the outputs of the redundant element, respectively hold a predetermined logic level.

When no redundancy replacement is required (RDDEN is of the ground level (VSS)), all the outputs XEN<3:0> are maintained at the power supply level (VCC) respectively. When the redundancy replacement is required (RDDEN is of the power supply level (VCC)), an output XEN<m> (where m=0, 1, 2 and 3) corresponding to a control gate electrode WL<m> (where m=0, 1, 2 and 3) that needs replacement, holds the ground level (VSS), and the output other than it, i.e., XEN<i> (where i≠m) holds the power supply level (VCC).

When the control signal /CHIP is transitioned to the ground level (VSS) in this condition, the predecode circuit 68 outputs the power supply level (VCC) to both of complementary address signals XA<n> (where n=0 and 1) and /XA<n> (where n=0 and 1).

Since both of the complementary address signals XA<n> (where n=0 and 1) and /XA<n> (where n=0 and 1) are of the power supply level (VCC), the redundancy determination circuit 12 outputs the power supply level (VCC) to the redundant addresses RXA<1:0> without depending on the output RA<n> (where n=0 and 1) of the redundant element.

Each of the decoders (XDEC<0:3>) ANDs the address signals XA<0> (/XA<0>) and XA<1> (/XA<1>) and the output XEN<m> (where m=0, 1, 2 and 3) of the redundancy selector array 64 and thereby drives the corresponding control gate electrode WL<m> (where m=0, 1, 2 and 3).

The redundant decoder (RXDEC) ANDs the outputs RXA<1:0> of the redundancy determination circuit 12 and the output RDDEN of the redundant element 10 and thereby drives the corresponding redundant control gate electrode RWL.

Since, in this case, both the address signals XA<1:0> and /XA<1:0> are of the power supply level (VCC) and the redundant addresses RXA<1:0> are also of the power supply level (VCC), all the control gate electrode WL<3:0> are selected where, for example, no redundancy replacement is required, i.e., the RDDEN is of the ground level (VSS) and all of XEN<3:0> are of the power supply level (VCC). When the redundancy replacement is required, i.e., the RDDEN is of the power supply level (VCC)), an output XEN<m> (where m=0, 1, 2 and 3) corresponding to a control gate electrode WL<m> (where m=0, 1, 2 and 3) that needs replacement, is the ground level (VSS), and the output XEN<i> (where i≠m) other that it is of the power supply level, the corresponding control gate electrode WL<i> (i≠m) and redundant control gate electrode are selected.

In the decoder which drives the selected control gate electrode, the output of a logic gate NA changes from the power supply level (VCC) to the ground level (VSS), the output of an inverter INV changes from the ground level (VSS) to the power supply level (VCC), and the output of a level shifter (LS0) changes to the power supply level (VCC).

When the control signal ERASE is next raised from the ground level (VSS) to the power supply level (VCC), the charge pump circuit 70 inputted with the control signal ERASE supplies a step-up level (VPP) to its corresponding step-up power supply line (VEP), and the output /ER of a level shifter (LS1) is changed to the ground level (VSS) and the output ER thereof is transitioned to the step-up level (VPP).

Owing to the supply of the step-up level (VPP) to the step-up power supply line (VEP), the output of the level shifter (LS0) of the decoder which drives the selected control gate electrode, is transitioned to the step-up level (VPP) and the output /ER thereof is brought to the ground level (VSS), whereby the selected control gate electrode is driven to the step-up level (VPP) through the corresponding level shifter (LS0) and transfer gate (CM01).

As described above, the NMOS transistor whose gate is biased to the power supply level (VCC), is added between the gate of the NMOS transistor constituting the transfer gate (CM00) that drives the control gate electrode (WL) upon reading, and the control signal (/ER). Therefore, it is possible to set the gate of the NMOS transistor constituting the transfer gate (CM00) to the potential greater than or equal to the power supply level (VCC) and drive the control gate electrode (WL) to the power supply level (VCC) by means of the NMOS transistor high in channel mobility as compared with the PMOS transistor. Thus, the present invention is capable of achieving the speeding-up of reading and area saving as compared with the case in which the control gate electrode (WL) is driven by the PMOS transistor.

The redundancy selectors (RXSEL) inputted with only the data (RA, /RA and RDDEN) programmed and retained in the redundant element in advance are provided for the respective decoders (XDEC), and the decoders are activated and deactivated by the outputs of the redundancy selectors, whereby the corresponding control gate electrodes (WL) can be selected without awaiting the result of a decision as to whether or not the redundancy replacement is required. Thus, it is possible to achieve the speeding up of reading, and an improvement in yield and an improvement in reliability by non-biasing of a control gate electrode (WL) with a defect to a high voltage.

While the preferred form of the present invention has been described, it is to be understood that modifications will be apparent to those skilled in the art without departing from the spirit of the invention. The scope of the invention is to be determined solely by the following claims.

What is claimed is:

1. A nonvolatile semiconductor memory device comprising:

memory cell transistors each having a floating gate electrode and a control gate electrode (WL), wherein the control gate electrode (WL) of the memory cell transistor takes a first power supply potential (VCC) and a second power supply potential (VPP) higher than the first power supply potential according to an operating state at the selection thereof, and wherein a first NMOS transistor of which the source is connected to a control (/ER) for controlling a second NMOS transistor which drives the control gate electrode (WL) to the first power supply potential (VCC), the drain is connected to the gate of the second NMOS transistor, and the gate is connected to the first power supply potential (VCC), is provided between the second NMOS transistor and the control signal (/ER), a PMOS transistor is provided in parallel with the second NMOS transistor, and the control gate electrode (WL) is driven by a transfer gate comprising the NMOS transistor and the PMOS transistor.

2. A nonvolatile semiconductor memory device comprising:

memory cell transistors each having a floating gate electrode and a control gate electrode (WL);

a plurality of decoders (XDEC) which drive the control gate electrodes (WL);

redundant control gate electrodes (WL) replaceable when the control gate electrodes (WL) are defective;

memory means (redundant element) which stores addresses for the defective control gate electrodes (WL);

said control gate electrode (WL) of the memory cell transistor assuming a first power supply potential (VCC) and a second power supply potential (VPP) higher than the first power supply potential according to an operating state at the selection thereof; and a plurality of redundancy selectors (RXSEL) for activating and deactivating the decoders (XDEC), which are provided every said decoders (XDEC);

wherein the redundancy selectors (RXSEL) input signals (RA, /RA and RDDEN) held in and outputted from the memory means (redundant element).

* * * * *